US009036674B2

(12) United States Patent
Hu et al.

(10) Patent No.: US 9,036,674 B2
(45) Date of Patent: May 19, 2015

(54) EFFICIENT THIRD-ORDER DISTRIBUTED FEEDBACK LASER WITH ENHANCED BEAM PATTERN

(71) Applicants: Massachusetts Institute of Technology, Cambridge, MA (US); LongWave Photonics LLC, Mountain View, CA (US)

(72) Inventors: Qing Hu, Wellesley, MA (US); Alan Wei Min Lee, Mountain View, CA (US); Tsung-Yu Kao, Fremont, CA (US)

(73) Assignees: Massachusetts Institute of Technology, Cambridge, MA (US); LongWave Photonics LLC, Mountain View, CA (US)

( * ) Notice: Subject to any disclaimer, the term of this patent is extended or adjusted under 35 U.S.C. 154(b) by 0 days.

(21) Appl. No.: 14/372,135

(22) PCT Filed: Mar. 5, 2013

(86) PCT No.: PCT/US2013/029147
§ 371 (c)(1),
(2) Date: Jul. 14, 2014

(87) PCT Pub. No.: WO2013/134281
PCT Pub. Date: Sep. 12, 2013

(65) Prior Publication Data
US 2015/0003481 A1 Jan. 1, 2015

Related U.S. Application Data

(60) Provisional application No. 61/607,662, filed on Mar. 7, 2012.

(51) Int. Cl.
*H01S 5/12* (2006.01)
*H01S 5/22* (2006.01)
(Continued)

(52) U.S. Cl.
CPC ... *H01S 5/22* (2013.01); *H01S 5/12* (2013.01); *H01S 5/1231* (2013.01); *H01S 5/2045* (2013.01); *H01S 5/2086* (2013.01); *H01S 1/02* (2013.01); *H01S 3/0675* (2013.01)

(58) Field of Classification Search
CPC .......... H01S 5/12; H01S 5/1231; H01S 5/20; H01S 5/2045; H01S 5/2086; H01S 5/22; H01S 5/3401
USPC ....................................... 372/50.12
See application file for complete search history.

(56) References Cited

U.S. PATENT DOCUMENTS

2004/0141540 A1 7/2004 Masood et al. ................. 372/97
2005/0058166 A1* 3/2005 Hu et al. ........................ 372/43
(Continued)

FOREIGN PATENT DOCUMENTS

KR 10-2011-0069453 6/2011 ............... H01B 5/06

OTHER PUBLICATIONS

Kao et al. "True Phase-Matched Third-order DFB Terahertz Quantum Cascade Lasers using Weakly-coupled Cavities," May 2011, OSA/CLEO, CTHE4.*
(Continued)

*Primary Examiner* — Yuanda Zhang
*Assistant Examiner* — Michael Carter
(74) *Attorney, Agent, or Firm* — Sunstein Kann Murphy & Timbers LLP

(57) ABSTRACT

A third-order distributed feedback laser has an active medium disposed on a substrate as a linear array of segments having a series of periodically spaced interstices therebetween and a first conductive layer disposed on a surface of the active medium on each of the segments and along a strip from each of the segments to a conductive electrical contact pad for application of current along a path including the active medium. Upon application of a current through the active medium, the active medium functions as an optical waveguide, and there is established an alternating electric field, at a THz frequency, both in the active medium and emerging from the interstices. Spacing of adjacent segments is approximately half of a wavelength of the THz frequency in free space or an odd integral multiple thereof, so that the linear array has a coherence length greater than the length of the linear array.

6 Claims, 8 Drawing Sheets

(51) Int. Cl.
*H01S 5/20* (2006.01)
*H01S 1/02* (2006.01)
*H01S 3/067* (2006.01)

(56) References Cited

U.S. PATENT DOCUMENTS

| | | | |
|---|---|---|---|
| 2010/0002739 A1 | 1/2010 | Hu et al. | 372/45.01 |
| 2011/0101250 A1 | 5/2011 | Hu | 250/493.1 |
| 2012/0051386 A1 | 3/2012 | Kim et al. | 372/96 |

OTHER PUBLICATIONS

International Searching Authority, International Search Report and Written Opinion for PCT/US2013/029147, mailed on May 29, 2013, 8 pages.

International Bureau of WIPO, International Preliminary Report on Patentability for PCT/US2013/029147, mailed Sep. 9, 2014, 6 pages.

* cited by examiner

Figure 3A
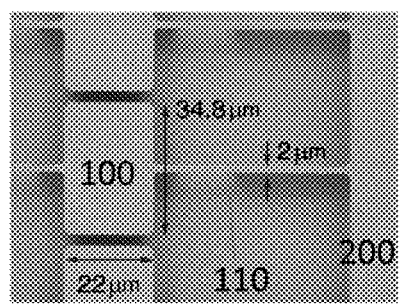
Figure 3B
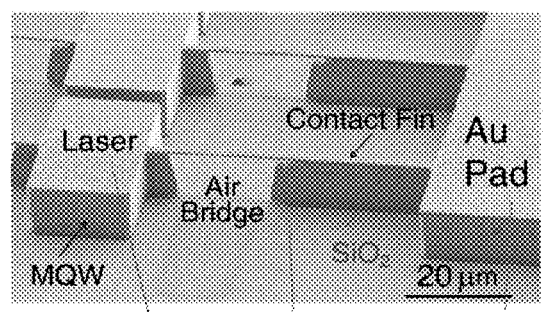
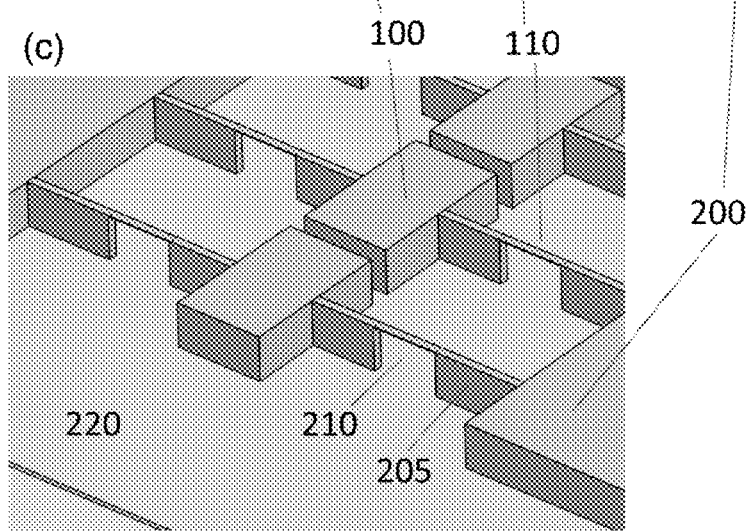
Figure 3C

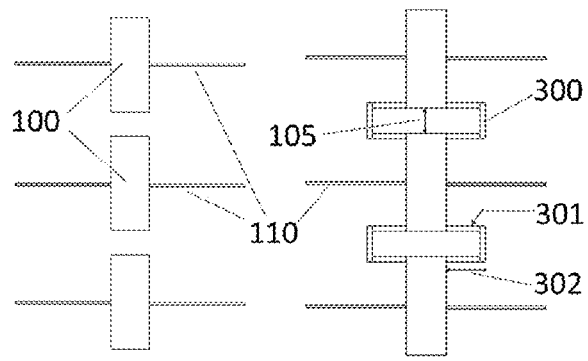 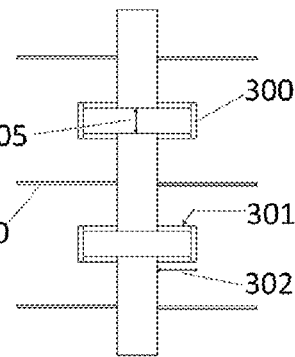 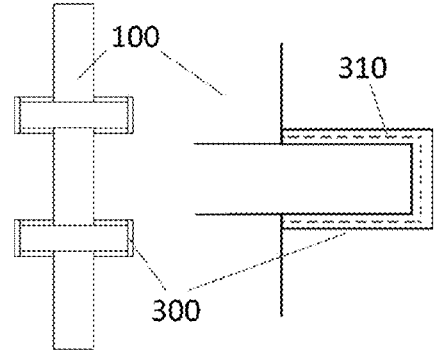
Figure 4A     Figure 4B     Figure 4C     Figure 4D

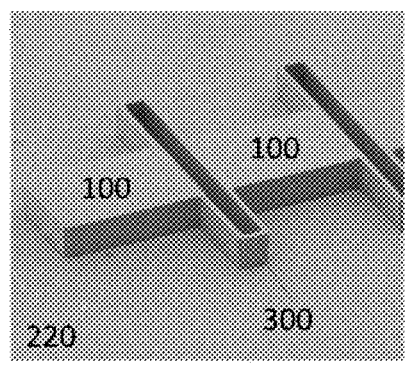
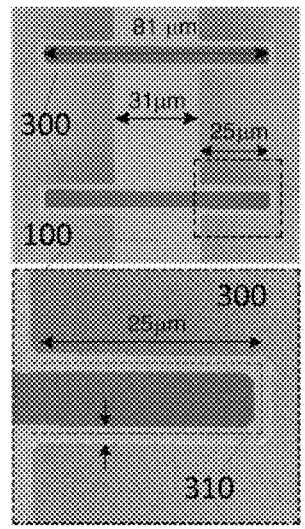
Figure 6A
Figure 6B
Figure 6C

FIGURE 8

EFFICIENT THIRD-ORDER DISTRIBUTED FEEDBACK LASER WITH ENHANCED BEAM PATTERN

RELATED APPLICATION

The present application claims the benefit of provisional application Ser. No. 61/607,662, entitled "High Efficient DFB Lasers with Good Beam Patterns" filed on Mar. 7, 2012, which is herein incorporated by reference.

FEDERALLY SPONSORED RESEARCH

This invention was made with Government support under grant NNX10AC70G awarded by NASA. The Government has certain rights in the invention.

TECHNICAL FIELD

The present invention relates to lasers, and more particularly to solid state lasers operating in the THZ frequency range.

BACKGROUND ART

Amanti et. al. Low-divergence single-mode terahertz quantum cascade laser, Nature Photonics, Vol. 3, page 586 (Published 2009) discloses a single mode semiconductor terahertz laser source with symmetric beam patterns. However, the mode selectivity of Amanti et al. is poor and single frequency is not always guaranteed. There is a need for better frequency control.

Amanti et. al. Low divergence Terahertz photonic-wire laser, Optics Express, Vol. 18, Issue 6, page 6390 (Published 2010) discloses a single mode semiconductor wire terahertz laser source with symmetric beam patterns. The total device length (and thus the total radiation power) is limited due to the phase mismatch phenomenon and the maximum electric current a wire laser can sustain. The device power out-coupling ability is also governed by its given geometry and cannot be adjusted. There is a need for better electric biasing mechanism. There is a need for adjustable power out-coupling.

Solbach et. al. Microstrip-Franklin Antenna, IEEE Transactions on Antennas and Propagation, Vol. 30, Issue 4, page 773 (Published July 1982) discloses a type of microstrip rectangular patch arrays with phasing stubs to achieve a co-phase current distribution driven by external sources.

Terahertz QCLs are expected to find applications as local oscillators for sub-millimeter wave heterodyne receiver systems at frequencies above 1 THz. Their low power consumption and small form factors make them suitable for applications in astrophysics and remote sensing. A robust single-mode laser that can sustain continuous-wave (cw) operation at an operating temperature of >77 K and emit >1 mW of optical power in a narrow and symmetric beam pattern is highly desired in these applications.

The best terahertz QCLs in terms of high-temperature operation have been demonstrated based on the metal-metal (MM) waveguides, which provide strong mode confinement and low waveguide losses. However, due to the sub-wavelength confinement of the waveguide, far-field beam pattern of a Fabry-Perot (F-P) MM THz laser is far from ideal Gaussian beams. Several approaches have been demonstrated to address this issue, such as photonic crystals or surface-emitting DFB laser arrays. The majority of these approaches focus on enlarging the two-dimensional light emitting area and thus suffer from degradation in continuous-wave (cw) performance due to their large power dissipation and difficulty in heat removal. Recently, a solution based on third-order DFB structures (Amanti et. al.) utilizes the so-called end-fire antenna effect to achieve tight beam patterns while minimizing the negative impact on cw performance.

SUMMARY OF THE EMBODIMENTS

Embodiments of the present invention relate generally to efficient semiconductor radiation-generating devices with single frequency (e.g. terahertz laser source based on quantum cascade lasers). In one embodiment of the invention comprises at least two, or more, short semiconductor laser cavities arranged to form a linear laser array, whose output radiation coherently combines at two ends of the array, forming tight and symmetric beam patterns, and the radiation power increases linearly with the total device length. Contact fins can be added on one or both sides of each laser cavity, which connect to larger contact pads on one or both sides to provide electrical bias. Microstrip antennas can also be attached near the physical separation between adjacent laser cavities, whose dimensions are adjusted to control the radiation efficiency of each aperture and also the phase relationship between adjacent cavities. Applications include high power, high efficiency terahertz radiation source as local oscillator for heterodyne detecting, or source for spectroscopic imaging of biological samples, remote detection of chemicals, and non-destructive evaluation.

In one embodiment, the present invention provides a third-order distributed feedback laser. The laser of this embodiment includes:

a substrate;

an active medium having a first surface disposed on the substrate and a second surface opposed to the first surface, the active medium being disposed on the substrate as a linear array of segments having a series of periodically spaced interstices therebetween, and wherein the linear array has a length;

a first conductive layer disposed on the second surface of the active medium on each of the segments and along a strip from each of the segments to a conductive electrical contact pad for application of current along a path including the active medium;

such that upon application of a current through the active medium, the active medium functions as an optical waveguide, and there is established an alternating electric field, at a THz frequency, both in the active medium and emerging from the interstices, wherein the electric fields emerging from any adjacent interstices are 180° out of phase with one another and geometry of segments and interstices defines the frequency, and wherein spacing of adjacent segments is approximately half of a wavelength of the THz frequency in free space or an odd integral multiple thereof, so that the linear array has a coherence length greater than the length of the linear array.

In a related embodiment, the linear array has a coherence length greater than twice the length of the linear array. Alternatively or in addition, the interstices are gaps.

Alternatively or in addition, the laser further includes a series of microstrips of a conductive material, wherein each microstrip is (i) disposed transversely to a longitudinal axis of the linear array, (ii) disposed proximately to a distinct one of the interstices, and (iii) configured as an antenna, so as to provide a degree of freedom for regulating coupling between the electric field inside the active medium and the electric field emerging from the distinct one of the interstices.

In another related embodiment each strip includes an expanse that forms a bridge, between its corresponding segment and the contact pad, that is devoid of physical contact with the active medium, the bridge having the effect of reducing current spreading.

Alternatively or in addition, the laser further includes a second conductive layer disposed on the first side of the active medium, so that the waveguide is formed between the first and second conductive layers.

In yet another embodiment, there is provided a third-order distributed feedback laser that includes:

a substrate;

an active medium having a first surface disposed on the substrate and a second surface opposed to the first surface, the active medium being disposed on the substrate as a linear array of segments having a series of periodically spaced interstices therebetween, and wherein the linear array has a longitudinal axis; and a conductive layer disposed on the second surface of the active medium on each of the segments and along a strip to a conductive electrical contact pad for application of current along a path including the active medium;

such that upon application of a current through the active medium, the active medium functions as an optical waveguide, and there is established an alternating electric field at a THz frequency, both in the active medium and emerging from the interstices, wherein the electric fields emerging from any adjacent interstices are 180° out of phase with one another and geometry of segments and interstices defines the frequency; and a series of microstrips of a conductive material, wherein each microstrip is (i) disposed transversely to a longitudinal axis of the linear array, (ii) disposed proximately to a distinct one of the interstices, and (iii) configured as an antenna;

so as to provide a degree of freedom for regulating coupling between the electric field inside the active medium and the electric field emerging from the distinct one of the interstice.

A related embodiment includes a second conductive layer disposed on the first side of the active medium, so that the waveguide is formed between the first and second conductive layers.

BRIEF DESCRIPTION OF THE DRAWINGS

The foregoing features of embodiments will be more readily understood by reference to the following detailed description, taken with reference to the accompanying drawings, in which:

FIG. 3A and FIG. 3B show scanning electron microscopic (SEM) pictures with different viewpoints of one configuration of the present invention. FIG. 3C shows a schematic diagram of the same.

FIGS. 4A, 4B, and 4C show schematic diagrams for different interstice configurations of present invention. FIG. 4D shows the total loop length along one side of microstrip antenna.

FIGS. 6A and 6B show scanning electron microscope (SEM) pictures with different viewpoints of one configuration of present invention. FIG. 6C shows a magnified SEM picture showing the total loop length of one side of the microstrip antenna.

FIG. 8 is a chart showing some the benefits of the present invention compared to prior developments.

DETAILED DESCRIPTION OF SPECIFIC EMBODIMENTS

Figure 1A:
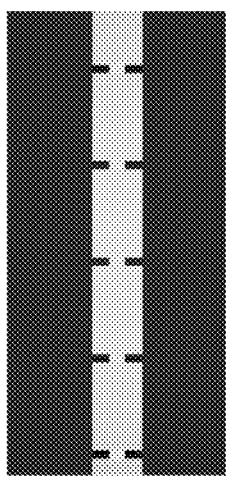
FIG. 1A schematically shows the corrugated 3rd-order DFB cavity in Amanti et. al.

Definitions. As used in this description and the accompanying claims, the following terms shall have the meanings indicated, unless the context otherwise requires:

An "interstice" between adjacent segments means a gap or an opposed pair of notches defining a part of a grating or other spacing arrangement.

The term "coherence length" of an optical waveguide is the length of the waveguide over which the relative phase of a wave in the waveguide changes by it radians relative to an a corresponding wave at the same frequency in free space traveling in the same direction outside of the waveguide.

In a third-order distributed feedback (DFB) laser, the effectiveness of the end-fire antenna depends on the phase-matching condition between the free space propagating radiation and the electric field inside each emission aperture. One can model these adjacent apertures as point radiation sources with opposite polarities (180° out of phase). If the modal index $n_{eff}$ is close to 3 in the waveguide, the distance between two adjacent apertures for third-order DFB gratings will be roughly half of a free-space wavelength $\lambda_o$. It is clear that the radiation from each opening will constructively add up at two far ends of this one-dimensional end-fire antenna array.

One can define an effective index as $n_{eff}=3\times\lambda_0/(2\times\Lambda)$, where $\lambda_0$ is the free-space wavelength and $\Lambda$ is the distance between adjacent apertures (the grating period). $n_{eff}$ can be treated as a figure-of-merit for evaluating the phase-matching condition. When $n_{eff}=3$, since electric field between adjacent apertures has 180° phase difference for the third-order grating, the phase-matching condition is perfectly met; but for $n_{eff}\neq 3$, phase errors will accumulate along the array. Emissions from different parts of the array then destructively cancel out after a certain device length. While emission will constructively add up and create narrower beam patterns for longer device under perfectly phase-matching condition, destructive superposition clearly happens under mismatched condition. Similar to the coherence length concept in nonlinear optical generation of radiations, we can define a coherence length $L_c$ as the length over which the relative phase of two collinearly traveling waves changes by $\pi$. Using the definition of $n_{eff}$, we have $L_c=\Lambda\times n_{eff}/|n_{eff}-3|$. For $n_{eff}\approx 3.2$, this coherence length would be ~16Λ, beyond which the beam pattern begins to degrade and the output power will actually decrease. The high refractive index ($n\approx 3.6$) of the GaAs active region in is still far from 3 and thus restricts the maximum usable length of the third-order DFB lasers.

Embodiments of the present invention overcome the problem of limited output power of a third-order distributed feedback (DFB) laser. Output power of a third-order DFB laser is in part determined by the length of the laser. However, as we have just shown, if the DFB laser is made too long, emission from the various sections may destructively interfere in the end-fire direction.

One embodiment of the present invention comprises many identical, electromagnetically-coupled, electrically isolated, short laser cavities arranged in a linear array form with a fixed periodicity. The laser oscillation frequency is mainly determined by dimensions of each cavity and is a weak function of the gap distance between cavities. The gap size can then be chosen to meet the phase-matching condition where the distance between two adjacent radiating elements is roughly equal to half of the free space wavelength of the radiation, or to an odd integral multiple of the half free space wavelength, so that the coherence length is larger than the length of the device. The output radiations from each gap coherently add up to form tight and symmetric beam patterns near two ends of array direction.

The physical separation (gap) between laser cavities introduces an extra design parameter to achieve a phase-matching condition without further reduction in the device's lateral dimensions, a condition which often leads to reduction of the mode confinement factor and thus deterioration in device performance.

An individual section is biased through separate contact fins so that the electric current can be brought directly to each laser cavity without sharing current path. This allows the construction of an arbitrarily long laser array without increasing the maximum electrical current flowing across any point of the laser device, which is essential for continuous wave operation and long-term device reliability.

The contact fins are placed near the center of each laser cavity to reduce the perturbations to laser operation. The contact fins then connect to two large side contact pad for the ease of wire-bonding. An insulation material, such as, but not limited to, silicon dioxide can be added beneath the contact fins to eliminate unwanted current flows and maintain proper bias condition. Openings on the dielectric material beneath contact fins are introduced to form "Air Bridge" structures.

Another embodiment of the present invention comprises many short laser cavities described in the first embodiment, but miniature antennas are placed on both sides of the device and in between adjacent cavities to enhance the electromagnetic radiation out-coupling from the electromagnetic oscillator. This approach essentially couples microstrip antennas to each laser cavity to form new electromagnetic radiation emitters whose radiation efficiency can be modified through varying its geometric shape, such as antenna length and width.

The total loop length of one side of the attached microstrip antennas is chosen to be an integer multiple of the radiation wavelength inside the microstrip antennas. This condition is essential for selecting the desired third-order DFB mode operation.

When a connected microstrip antenna is used, use of the separated contact fins is optional since electric current can flow though one laser cavity to another through the connected antennas.

In different embodiments, the geometric shape of each individual cavity can be chosen different or even irregular as long as only one electromagnetic mode exists in the frequency range of interest.

In different embodiments, the geometric shape of each coupled microstrip antenna can be chosen to be different from a simple rectangular shape, such as a half-circle, triangular, or a spiral.

In different embodiments, the use of a coupled microstrip antenna can also be applied to 2nd-order DFB surface-emitting devices to increase power out-coupling efficiency.

In different embodiments, the present invention may be used with different wavelength semiconductor lasers, such as infrared QCLs, visible, infrared or ultraviolet semiconductor lasers.

Figure 1B:
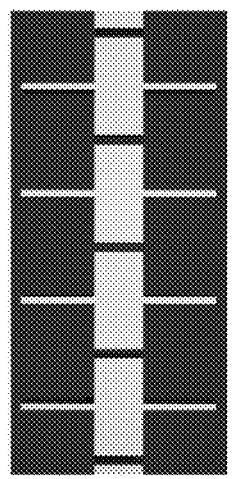
FIGS. 1B and 1C show one configuration of present invention.
Figure 1C:
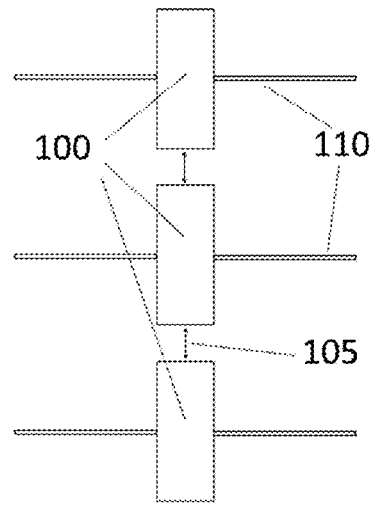

FIG. 1A shows the top schematic of corrugated $3^{rd}$-order DFB cavity demonstrated by Amanti et. al. The center of the figure, depicted as a light gray region, shows the metal on the top of the waveguide. The periphery of the figure, depicted as a dark gray region, shows the bottom ground metal. The gain medium (namely, the material which provides power amplification at designed frequency when properly electronically biased) is sandwiched between the top and bottom metal. For convenience of illustration, only a small number of periods are shown. FIGS. 1B and 1C show the top schematic of one type of configuration of the present invention. Items 100 are the electrically separated, short Fabry-Perot laser cavities. Items 110 are the contact fins for passing the electric current from the larger side contact pads (not shown in this figure) to individual laser cavities. Item 105 is the physical separation (interstice or gap) between two adjacent laser cavities.

Figure 2A:
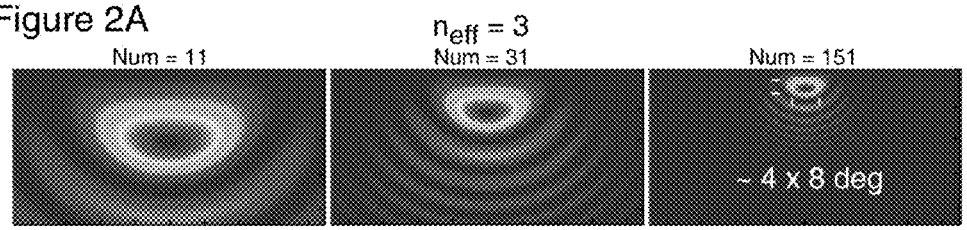
FIG. 2A Shows the simulated beam patterns from different device lengths when the phase-matching conditions are met for varying lengths of 3rd-order DFBs.
Figure 2B:
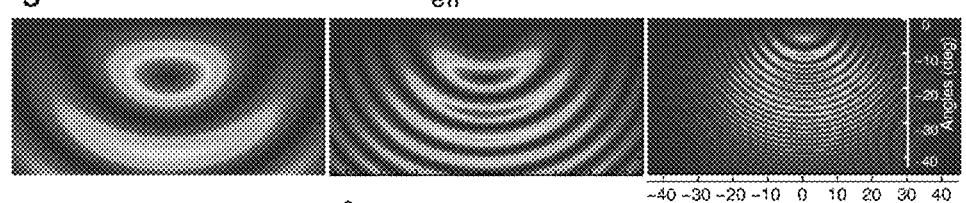
FIG. 2B shows the simulated beam patterns when the phase-matching condition is not met.
Figure 2C:
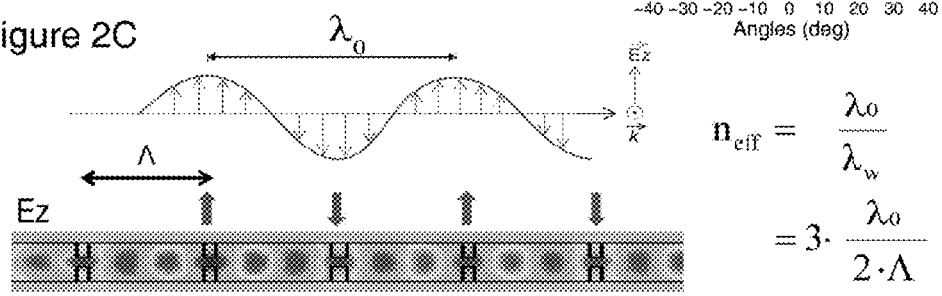
FIG. 2C explains the working principle of 3rd-order DFB laser.

FIGS. 2A, 2B, and 2C illustrate the working principle of a 3rd-order DFB laser, with respect to which we defines a figure-of-merit $$n_{\it eff} = 3 \times \frac{\lambda_0}{2\Lambda},$$

where $\lambda_o$ is the free space wavelength of the radiation and $\Lambda$ is the distance from the center of 105 (gap) to the center of adjacent 105, usually defined as the periodicity of the linear array. From FIG. 2C, it is clear that when $n_{\it eff}=3$, then $$\Lambda = \frac{\lambda_0}{2} \Big)$$

the radiation propagating outside the waveguide and electric field at each gap will have fixed phase relationship, this is the occurrence that phase-matching condition is met and coherent radiation emitting from every gap will constrictively combine forming tight and symmetric beam patterns at two far end of the linear laser array. Limited by the high dielectric constant of the gain medium commonly used in laser (gallium arsenide GaAs, optical index ~3.6) the structure demonstrated by Amanti et. al. typically has $n_{\it eff}$~3.2-3.4. Simulated beam patterns from different device lengths (device periods from Num=11 to Num=151) when phase-matching condition is not satisfied ($n_{\it eff}$~3.18) are shown in FIG. 2B. Clearly the beam pattern starts deteriorating rapidly after a certain device length, which eliminates the possibility of scaling the device length to obtain higher power and better beam divergence. In embodiments of the present invention, since the gap size can be adjusted so that the periodicity $\Lambda$ of the array equals to $$\frac{\lambda_0}{2}$$

or an odd integer multiple of $$\frac{\lambda_0}{2} \Big( \text{e.g. } 3\frac{\lambda_0}{2}, 5\frac{\lambda_0}{2}, 7\frac{\lambda_0}{2} \ldots \Big),$$

the phase-matching condition can be satisfied. Similar beam pattern simulation for such a perfectly phase matched device is shown in FIG. 2A. The beam divergence is now inversely proportional to the square-root of the total device length and combining radiated power from every part of the linear array is achieved.

FIGS. 3A and 3B show scanning electron microscopic (SEM) pictures with different viewpoints (top view and isotropic view, respectively) of one configuration of the present invention working around 3 THz. Some critical dimensions of the invention are also shown. Item 200 is the large contact pad on the side of the laser cavity. A wire-bond can be made on 200 to provide external electrical bias. A thin layer of electrical insulation material (e.g. silicon dioxide, SiO$_2$) is placed beneath the contact pad to provide insulation. Item 205 is a structure left for supporting the contact fins. Item 210 is the "Air Bridge"-like structure beneath the contact fin, wherein the conductive dielectric material has been completely removed to avoid a stray electric current. Item 220 is the bottom ground metal.

FIGS. 4A and 4B are schematic diagrams for different interstice configurations of present invention. FIG. 4A shows an embodiment having only a separated short laser cavity with contact fins. FIG. 4B shows a microstrip antenna (300) attached between two adjacent cavities, wherein items 301 and 302 depict the width and the length of the antenna arm, respectively. Contact fins are still present. FIG. 4C illustrates a simplified configuration without contact fins. Since separated laser cavities are now connected by the antenna, electric current can flow on the top metal through whole laser array. FIG. 4D illustrates a zoomed-in schematic for a microstrip antenna on one side of the laser cavity in accordance with an embodiment of the present invention. Item 310 (a red dashed line) shows the total loop length (L.L.) along one side of the microstrip antenna. The Loop length is chosen so that $$L.L. \approx m \times \lambda_{a.w.}$$

where m is an integer number, $\lambda_{a.w.}$ is the wavelength inside the narrow waveguide which forms the antenna arm. The condition ensures the electric fields inside two adjacent laser cavities will have the same polarity across the separation gap.

Figure 5A:
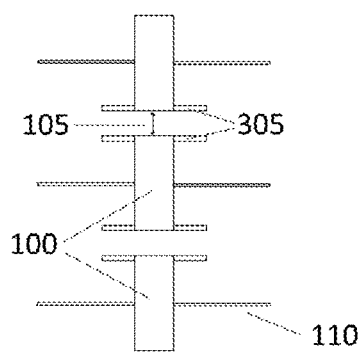
FIGS. 5A, 5B and 5C shows schematic diagrams for present invention when different microstrip antennas are attached to the laser cavities. Different contact fin positions are also shown.
Figure 5B:
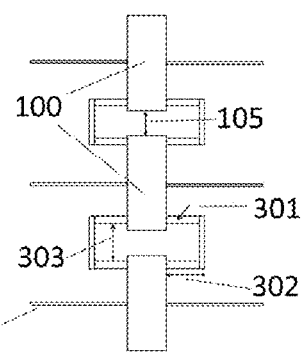
Figure 5C:
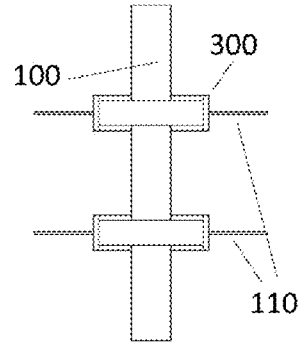

FIGS. 5A, 5B, and 5C are schematic diagrams for embodiments of the present invention wherein different microstrip antennas are attached to the laser cavities. The radiation efficiency of each coupled microstrip antenna can be adjusted. In FIG. 5A, item 305 is another type of microstrip antenna which does not form a closed loop. In FIG. 5B is yet another type of microstrip antenna whose antenna arm separation (303) is not the same as the laser cavity separation (105). This configuration provides one extra degree of freedom to adjust radiation efficiency without dramatically changing the total loop length of the antenna. In FIG. 5C, the position of contact fins can also be placed near the tip of the microstrip antennas.

FIGS. 6A and 6B show scanning electron microscopic (SEM) pictures with different viewpoints of one configuration of the present invention working around 4 THz. Critical dimensions are shown in the pictures. FIG. 6C is a zoomed-in view of one antenna (300) showing total loop length (310) as a red dashed line.

Figure 7:
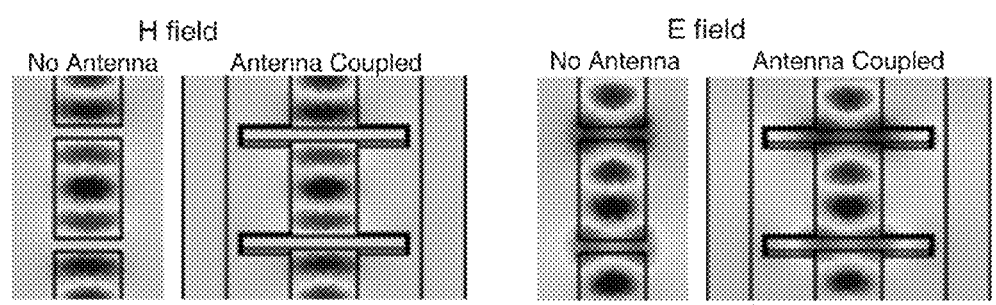
FIG. 7 shows finite-element (FEM) electromagnetic simulated magnetic fields and electric fields inside the laser cavities with or without coupling to microstrip antennas.

FIG. 7 shows finite-element (FEM) full-wave electromagnetic simulated magnetic fields and electric fields inside the laser cavities with or without coupling to microstrip antennas. It is clear that the electromagnetic field distributions in the laser are virtually identical before and after the introduction of coupled microstrip antennas. The most significant change is in the electric fields near the gap. The antenna coupled version has a larger electric field distribution at the gap, which is responsible for the enhanced radiation efficiency.

Figure 8:
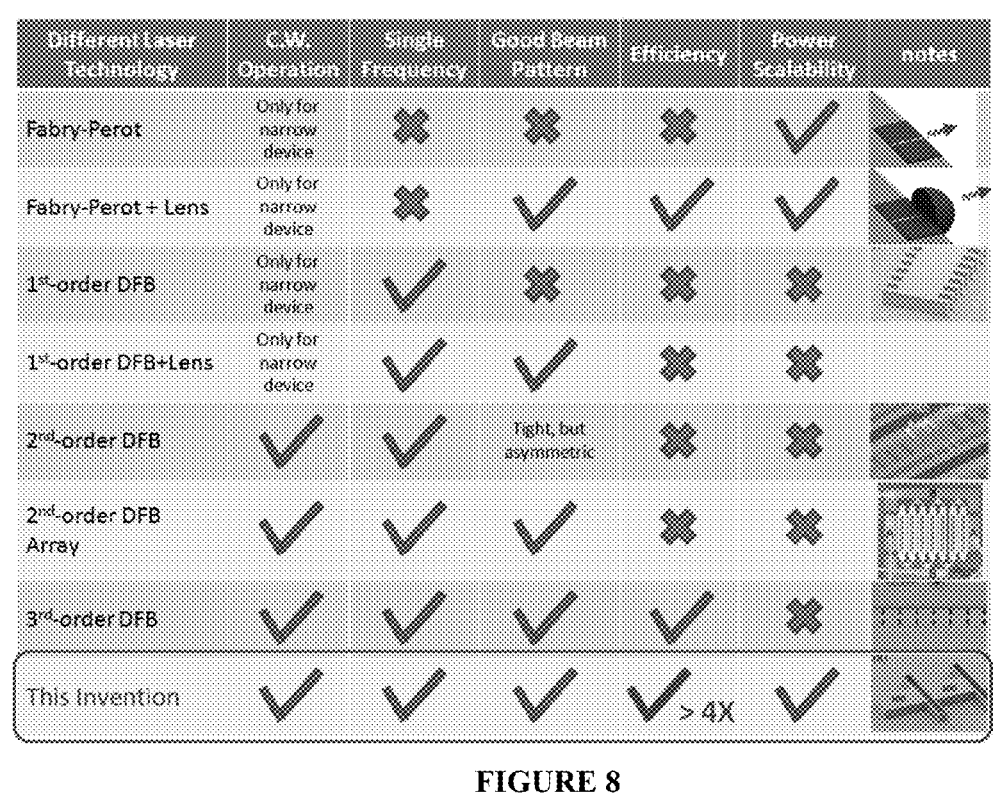

FIG. 8 is a chart showing some the benefits of embodiments of the present invention in comparison to prior art developments.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A third-order distributed feedback laser comprising:
   a substrate;
   an active medium having a first surface disposed on the substrate and a second surface opposed to the first surface, the active medium being disposed on the substrate as a linear array of segments having a series of periodically spaced interstices therebetween, and wherein the linear array has a longitudinal axis;
   a conductive layer disposed on the second surface of the active medium on each of the segments and along a strip to a conductive electrical contact pad for application of current along a path including the active medium;
   such that upon application of a current through the active medium, the active medium functions as an optical waveguide, and there is established an alternating electric field at a THz frequency, both in the active medium and emerging from the interstices, wherein the electric fields emerging from any adjacent interstices are 180° out of phase with one another and geometry of segments and interstices defines the frequency; and
   a series of microstrips of a conductive material, wherein each microstrip is (i) disposed transversely to a longitudinal axis of the linear array, (ii) disposed proximately to a distinct one of the interstices, and (iii) configured as an antenna;
   so as to provide a degree of freedom for regulating coupling between the electric field inside the active medium and the electric field emerging from the distinct one of the interstice.

2. A third-order distributed feedback laser according to claim 1, further comprising a second conductive layer disposed on the first side of the active medium, so that a waveguide is formed between the first and second conductive layers.

3. The third-order distributed feedback laser according to claim 1, wherein the linear array has a coherence length greater than twice the length of the linear array.

4. The third-order distributed feedback laser according to claim 1, wherein the interstices are gaps.

5. The third-order distributed feedback laser according to claim 1, wherein each strip includes an expanse that forms a bridge, between its corresponding segment and the contact pad, that is devoid of direct physical contact with the active medium, the bridge having the effect of reducing current spreading.

6. A third-order distributed feedback laser according to claim 1, further comprising a second conductive layer disposed on the first side of the active medium, so that the waveguide is formed between the first and second conductive layers.

* * * * *